(12) United States Patent
Fournel et al.

(10) Patent No.: US 7,550,052 B2
(45) Date of Patent: Jun. 23, 2009

(54) METHOD OF PRODUCING A COMPLEX STRUCTURE BY ASSEMBLING STRESSED STRUCTURES

(75) Inventors: Franck Fournel, Moirans (FR); Hubert Moriceau, Saint-Egreve (FR); Phillippe Montmayeul, Bernin (FR)

(73) Assignee: Commissariat a l'Energie Atomique, Paris (FR)

( * ) Notice: Subject to any disclaimer, the term of this patent is extended or adjusted under 35 U.S.C. 154(b) by 307 days.

(21) Appl. No.: 10/537,679

(22) PCT Filed: Dec. 4, 2003

(86) PCT No.: PCT/FR03/03590

§ 371 (c)(1),
(2), (4) Date: Dec. 16, 2005

(87) PCT Pub. No.: WO2004/064132

PCT Pub. Date: Jul. 29, 2004

(65) Prior Publication Data

US 2006/0141742 A1    Jun. 29, 2006

(30) Foreign Application Priority Data

Dec. 9, 2002    (FR) .................................. 02 15552

(51) Int. Cl.
*B32B 37/00* (2006.01)
(52) U.S. Cl. ................ 156/160; 156/153; 156/281; 148/DIG. 12; 148/DIG. 135; 148/DIG. 159
(58) Field of Classification Search .............. 156/153, 156/60, 160, 281; 148/DIG. 12, DIG. 135, 148/DIG. 159; 437/225, 974, 901
See application file for complete search history.

(56) References Cited

U.S. PATENT DOCUMENTS

| | | | | | |
|---|---|---|---|---|---|
| 4,671,846 | A | * | 6/1987 | Shimbo et al. | 438/455 |
| 4,752,180 | A | * | 6/1988 | Yoshikawa | 414/737 |
| 4,830,984 | A | * | 5/1989 | Purdes | 438/492 |
| 4,832,253 | A | | 5/1989 | Kloucek et al. | |

(Continued)

FOREIGN PATENT DOCUMENTS

EP    0 383 391 A1    2/1990

(Continued)

OTHER PUBLICATIONS

Feijoo et al., "Prestressing of Bonded Wafers", Proceedings of the 1st International Symposium on Semiconductor Wafer Bonding, Science Technology and Applications, vol. 92-7, The Electrochemical Society (1992), pp. 230-238.

(Continued)

*Primary Examiner*—Jeff H Aftergut
(74) *Attorney, Agent, or Firm*—Brinks Hofer Gilson & Lione

(57) ABSTRACT

The invention relates to a method of producing a complex microelectronic structure, in which two basic microelectronic structures are assembled at the two respective connecting faces thereof. The invention is characterized in that, before assembly, a difference is created in the tangential stress state between the two faces to be assembled, said difference being selected such as to produce a pre-determined stress state within the assembled structure under given conditions in relations to the assembly conditions.

36 Claims, 6 Drawing Sheets

U.S. PATENT DOCUMENTS

| | | | | |
|---|---|---|---|---|
| 4,939,101 A | * | 7/1990 | Black et al. | 438/455 |
| 5,071,785 A | * | 12/1991 | Nakazato et al. | 438/457 |
| 5,129,827 A | * | 7/1992 | Hoshi et al. | 438/457 |
| 5,131,968 A | | 7/1992 | Wells et al. | |
| 5,478,782 A | * | 12/1995 | Satoh et al. | 438/455 |
| 2006/0205179 A1 | * | 9/2006 | Fournel et al. | 438/458 |

FOREIGN PATENT DOCUMENTS

| | | |
|---|---|---|
| EP | 0 895 282 A2 | 2/1999 |
| EP | 0 410 679 A1 | 7/1999 |
| EP | 0 895 282 A3 | 1/2000 |
| FR | 2 789 518 A1 | 8/2000 |
| JP | 1-169917 | 7/1999 |

OTHER PUBLICATIONS

Feijoo et al., "Generalized Formula for Curvature Radius and Layer Stresses Caused by Thermal Strain in Semiconductor Multilayer Structures," Appl. Phys. 54(1), 1983, p. 83.

S. Timoshenko, "Analysis of Bi-Metal Thermostats," J. Opt. Soc. Am. 11 (1925), p. 233-256.

* cited by examiner

METHOD OF PRODUCING A COMPLEX STRUCTURE BY ASSEMBLING STRESSED STRUCTURES

This application claims benefit of priority to French Patent Application No. FR 0215552 filed Dec. 9, 2002.

TECHNICAL FIELD

The invention relates to a method of producing a complex structure by assembling two basic microelectronic structures. The structures may be microelectronic, microtechnological, nanotechnological or nanoelectronic.

BACKGROUND

The use of these complex structures, and in particular those obtained by assembling structures of different materials, is increasingly widespread in microelectronics, for highly diverse reasons. For example, these complex structures, also known as heterostructures, reduce costs by avoiding the use of costly solid (for example silicon carbide) substrates. In the case of an SOI (silicon on insulator) substrate, for example, they also facilitate isolating components from each other, thereby increasing the integration density, limiting component consumption, increasing speed, and the like.

To be advantageous, these complex structures must be compatible, subject to minor modifications, with the standard technology steps of microelectronics, for example bonding, heat treatment, lithography, doping, implantation and epitaxial growth. Now, most of these steps necessitate large changes in temperature.

Unlike a solid substrate, which changes homogeneously with temperature, heterostructures are sensitive to changes in temperature, especially if the materials constituting them have different coefficients of thermal expansion. The change of temperature can generate high internal stresses within the heterostructure because the materials change differently with temperature. If the stresses are too high, they can damage or even destroy the complex structure. The conventional solution to avoiding such problems is to limit temperature changes to moderate levels compatible with the existing structure.

There therefore remains the problem of producing a complex structure reliably and reproducibly by assembling two different materials so that the structure is able, without risk, to withstand technology steps at higher temperatures or of longer duration than those to which the art is currently limited.

Another major problem in microelectronics is that of being able to produce good quality epitaxially grown material of a given kind on another material. In this case, the problem lies in the possible difference between the lattice parameters of the two materials, i.e. that of the substrate and that to be grown epitaxially. For example, if $Si_{0.8}Ge_{0.2}$ is to be grown epitaxially on silicon, the lattice difference between these two materials is so large that it is not possible to grow an $Si_{0.8}Ge_{0.2}$ layer of more than a few hundred angstrom units thickness before the layer relaxes and forms numerous dislocations that are very harmful to crystal quality.

It is known in the art that curving a structure modifies its lattice parameter. However, it is not immediately apparent how to exploit this fact to produce epitaxial growth of high quality. Therefore, a need exists to accurately and reliably produce an epitaxially grown substrate with a matched lattice parameter from a given unsuitable substrate without modifying the epitaxial growth system.

BRIEF SUMMARY

The invention addresses the two problems stated hereinabove.

It proposes a method of producing a complex structure by bringing into contact and assembling respective connecting faces of two basic structures. The method is characterized in that, before bringing them into contact, a tangential stress state difference is created between the two faces to be assembled, this difference being selected to obtain within the assembled structure a predetermined stress state under given conditions relative to the assembly conditions.

Thus the invention teaches the deliberate generation of stresses in an assembled complex structure, for example to enable it thereafter to compensate stresses generated during subsequent technology steps, and in particular steps necessitating temperature changes: this subsequently authorizes reliable and reproducible technology steps involving greater temperature differences or of longer duration than before.

It is to be noted that prestressing the heterostructure between successive steps (typically at room temperature) in fact has no significant drawback.

Moreover, the invention produces an autonomous epitaxial growth support in the form of a stressed complex structure suitable for a given material to be grown epitaxially. Because of the internal stresses generated within this structure during assembly, and more particularly surface stresses, the surface lattice parameter can be controlled accurately with no device other than the other portion of the complex structure. Thus epitaxial growth of good quality can be obtained using this stressed complex structure.

It is to be noted that, in an entirely different context, the paper by D. Feijoo, I. Ong, K. Mitani, W. S. Yang, S. Yu and U. M. Gösele, "Prestressing of bonded wafers", Proceedings of the 1st international symposium on semiconductor wafer bonding, science technology and applications, Vol. 92-7, The Electrochemical Society (1992) page 230, proposes a method of generating internal stresses within a complex structure, but this is not to address either of the two problems as stated, but rather with a view to improving the mechanical stability of the structure.

To this end, two structures, in this instance two silicon wafers, are bonded by molecular adhesion under the standard conditions. The complex structure formed in this way is then stressed by curving it by applying a pointer to the center of the structure, which is fixed at its periphery. By curving the structure sufficiently, the bonding interface yields: the two wafers separate and are then rebonded immediately with the new curvature that has been achieved. This separation/rebonding process may be carried out several times, depending on the bonding energy at the interface and the force applied by means of the pointer. When the authors release the stress caused by the pointer, the complex structure relaxes and stabilizes at a radius of curvature that depends on that obtained at the time of the last separation/rebonding of the complex structure stressed by the pointer. Internal stresses are therefore generated within the complex structure.

However, the above document neither describes nor suggests generating these stresses in a complex structure to address problems of temperature behavior or to adjust a lattice parameter.

Moreover, the internal stresses generated within the structure are not easily adjustable using the above technique because they are dependent on the relative values of the elastic deformation energy of the structure and the bonding energy. Moreover, as the authors indicate, the above method cannot be used for molecular bonding at too high an energy since, under such conditions, the assembled two structures do not separate and, if the pointer is removed within the range of elastic deformation of the structure, the latter reverts to its initial state at the time of molecular bonding. The structure therefore has no curvature and therefore no internal stresses. Now, it is often technologically beneficial to have a high bonding energy, for example to ensure good solidity and a bonding interface of good quality.

The technique described in the above document can undoubtedly be used to generate stresses in a complex structure, but this idea is not associated with either of the two technical problems cited above. It is therefore only a posteriori that the above document might be seen to have analogies with the invention. In any event, uncontrolled separation/rebonding makes the proposed technique difficult to adjust. It is also limited to structures assembled with limited bonding energies.

The method of the invention does not have these limitations: the stress state generated within the complex structure depends on stresses generated independently in each basic structure before assembly, which stresses are seen to be adjustable very accurately. The method is therefore reliably and accurately reproducible and adjustable. The bonding forces between the basic structures are not limited either, since in our method the complex structure does not need to be separated.

The tangential stress difference between the faces to be bonded of the two basic structures may advantageously be created by deforming (mainly elastically) each of said structures before assembly. A simple and easy technique for generating stresses is to curve these structures.

In a preferred embodiment, the two structures are curved so that the two faces to be assembled are respectively concave and convex. They may be complementary or even respectively spherical concave and spherical convex.

For example, the structures may be curved to generate stresses by applying localized and/or distributed mechanical forces to the structures to be deformed.

In a preferred embodiment, a pressure difference may be created between the two faces of the structure to be curved. The means for producing this pressure difference and for obtaining a basic structure having a face to be assembled include aspirating said structure onto a concave preform of suitable profile selected as a function of that to be imparted to the face to be assembled and on which the structure rests locally at its periphery. Seals may advantageously be provided to improve the seal between the structure and the preform. Aspiration of said structure into a cavity may also be mentioned, the structure resting locally at its periphery on a seal bordering the cavity.

The curved basic structure may be obtained by deforming the above structure between two complementary preforms, one of which is concave and the other of which is convex, with profiles selected as a function of that to be imparted to the face to be assembled. In this case, aspiration channels may be provided on the preform which receives the basic structure to keep the structure curved, once the other preform has been removed. This other preform may advantageously be the other basic structure to be assembled, which has already been curved to the required profile.

Another option is to apply mechanical forces simultaneously to both of the structures to be assembled, for example by deforming the two structures between two preforms with profiles selected as a function of those to be imparted to the faces to be assembled.

It is preferable if:
- mechanical forces are applied to one or more of the substrates by means of a preform consisting of a mold,
- this preform consists of a porous mold, and
- mechanical forces are applied to the substrates with the aid of at least one deformable preform.

The two structures are preferably assembled by molecular bonding, achieving high adhesion forces and an interface of good quality, either directly (for example by plasma processing, UV/ozone processing or bonding in a vacuum) or in an assisted manner (for example by heat treatment). In this case, before or after creating the stress state difference between the two faces to be assembled, said faces are treated to facilitate subsequent bonding. For example, the treatment may consist in mechanical and/or chemical polishing, chemical treatment, UV/ozone treatment, RIE (reactive ion etching), plasma treatment, or annealing in hydrogen.

According to other preferred features of the invention, which may where applicable be combined:
- the substrates are assembled by direct contact, the surface of at least one of the substrates being adapted to prevent air from being trapped between the assembled surfaces,
- at least one of the substrates is pierced,
- that substrate is pierced at its center,
- at least one of the substrates includes at least one dead-end channel discharging at the edge of the substrate,
- the substrates are assembled by means of a flow layer,
- assembly is carried out at a temperature higher than room temperature,
- the substrates are heated by contact with heated preforms, and
- the preforms are heated to respective different temperatures.

The method of the invention may include supplementary steps.

Thus it may further include a technology step including a change of temperature. In this case, the tangential stress state difference between the two faces to be assembled is selected so that, during this technology step, the stresses within the assembled structure reach or advantageously remain below a predetermined stress level. For a heat treatment step, for example, the level of stresses not to be exceeded is selected to ensure that the structure is mechanically strong, for example at the heat treatment temperature.

The method of the invention may equally further include, after assembling the two basic structures, a step of thinning one of these two structures to produce a thin film. In this case, the tangential stress state difference between the two faces to be assembled may be selected to impose a given stress level within the resulting thin film. The thin film is advantageously assembled to another basic structure by creating, prior to assembly, a tangential stress state difference between the two faces to be assembled, that difference being selected to obtain within the new assembled structure a predetermined stress state under given conditions relative to the assembly conditions.

The method may equally further include an epitaxy step for producing an epitaxially grown film of a material on an external face of the complex structure. The tangential stress state difference is then selected so that, at the epitaxy temperature, that external face has a preselected lattice parameter that is advantageously compatible with epitaxial growth of the required material.

The face on which the epitaxy is to be effected is advantageously the face of a thin film obtained by thinning a stressed complex structure obtained by assembling two stressed basic structures (see above). A practically flat epitaxy substrate is then obtained.

The epitaxy substrate may be produced in a more complex manner enabling it to be obtained from a given material having a lattice parameter very different from that of the starting material.

For example, the method may further include the following steps:

assembling the complex structure including the epitaxially grown film onto another "basic" structure via two respective connecting faces by creating a tangential stress state difference between these two new faces to be assembled prior to assembly, thinning the complex structure to expose a face of the epitaxially grown thin film, and epitaxially growing a new material on the exposed face of the thin film.

The tangential stress state difference between the two new faces to be assembled is selected so that the lattice parameter of the epitaxially grown thin film is compatible with epitaxial growth of the new material.

The above method may always be iterated as required to obtain a different (increasing or decreasing) lattice parameter.

BRIEF DESCRIPTION OF THE DRAWING

Other aspects and advantages of the invention will become apparent on reading the following detailed description of particular embodiments of the invention provided by way of nonlimiting examples. The description refers to the appended drawings, in which.

DETAILED DESCRIPTION

Curved Bonding

In the figures to which the following description refers, identical, similar or equivalent parts are identified by the same reference numbers. Also, to clarify the figures, the various items are not represented to a consistent scale.

Figure 1:
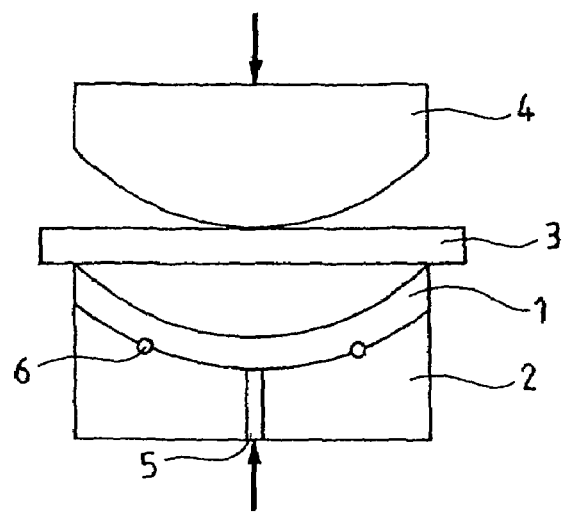
FIG. 1 is a diagram of one non-limiting embodiment of the method of the invention.

FIG. 1 shows one non-limiting embodiment of the invention. A first basic structure 1 is deformed by aspirating it onto a first preform 2 of specific shape, for example of spherical concave shape. Aspiration is effected by means of aspiration channels 5 opening onto the surface of the preform. Seals 6 at the periphery of the preform support the first structure 1 and ensure a pressure difference is obtained between the two faces of that structure. Because of this pressure difference, the structure is deformed to espouse the shape of the first preform 2. Because of this deformation, stresses familiar to and quantifiable by the person skilled in the art are generated within the first structure 1 and in particular at its exposed face (here its upper face).

A second structure 3 is then offered up facing the exposed face of the first structure 1. A second preform 4 with a suitable shape that is advantageously complementary to the shape of the first preform 2, for example of spherical convex shape, is provided to deform the second structure 3 between the second preform 4 and the first structure 1. The arrow represented in FIG. 1 symbolizes the application of forces to effect the deformation proper. During the deformation, the second structure 3 is progressively deformed on contact with the first structure 1 until it espouses its shape.

The two faces to be assembled having been treated in a manner familiar to the person skilled in the art to enable bonding by molecular adhesion, for example prior to stressing the two structures, bonding is then effected when the two faces coincide.

A complex structure is then obtained formed by the assembly of two stressed structures having at their assembled faces a known tangential stress difference that is imposed by the respective deformation of the two structures prior to bonding.

The person skilled in the art knows how to link the deformation imposed on the structures accurately to the stress levels obtained in the structure and in particular those obtained on the faces to be assembled. He therefore knows, through an appropriate choice of the shapes of the preforms 2 and 4, how to impose a precise tangential stress difference between the two faces to be assembled before bonding and thus to impose stresses throughout the complex structure once assembled. The preforms may be rigid porous or non-porous molds, for example, or deformable membranes.

Figure 2:
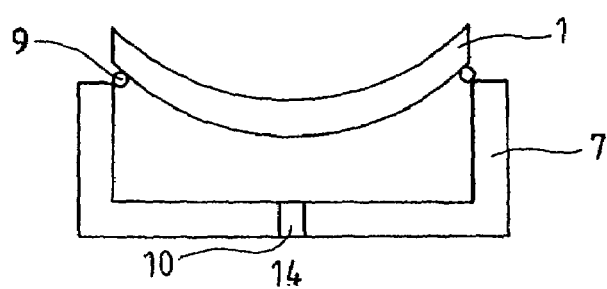
FIGS. 2, 3 and 4 show different ways of stressing basic structures to be assembled.

As shown in FIG. 2, a variant of the method replaces the first preform 2 with a hollow device 7 having a central cavity 8. The periphery of the first structure 1 then rests on this device with seals 9 sandwiched between them. Aspiration channels 10 reduce the pressure inside the cavity. Adjusting the pressure difference between the two faces of the first structure 1 deforms the first structure 1 to a particular curvature. For example, for a vacuum in the cavity of approximately 0.25 bar, the other face of the structure being exposed to atmospheric pressure, a deflection of 3 mm is obtained in the case of a standard 200 mm diameter silicon wafer 750 µm thick using a seal of 195 mm diameter. The first structure 1 can then be assembled to the second structure 3 in the manner explained above.

Figure 3:
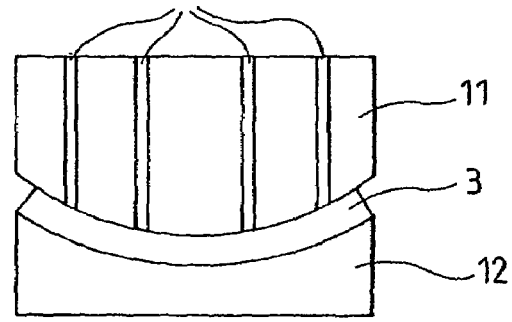

FIG. 3 shows another variant which consists in deforming the second structure 3 between two appropriate preforms of complementary shape, one (12) concave and the other (11) convex. The convex preform is provided with aspiration channels 14 for holding the second structure 3 in position after deformation and removal of the concave preform 12. The second structure 3 may then be assembled to the first structure 1, which itself has already been deformed, by bonding with the aid of an adhesive, for example. Another variant assembles the two basic structures by molecular bonding at room temperature and without stress. The assembled structure is then deformed between two complementary molds. After verifying that each of the structures is fastened to one of the molds (for example by aspiration), the assembled structure is separated from the molecular bonding area by any means known to the person skilled in the art. This yields two stressed basic structures that may thereafter be assembled in accordance with the invention. This variant has the advantage of preserving the surface state of the faces to be assembled, for example enabling assembly of the two stressed basic structures by further molecular bonding.

More generally, the assembly of the two basic structures can therefore be effected by molecular adhesion, by bonding by means of an adhesive, or by bonding by means of a bedding layer.

An adhesion layer may be used between the preform and the structure to be deformed or electrostatic or magnetic forces may be used to hold the preform and the curved basic structure in contact.

Figure 4:
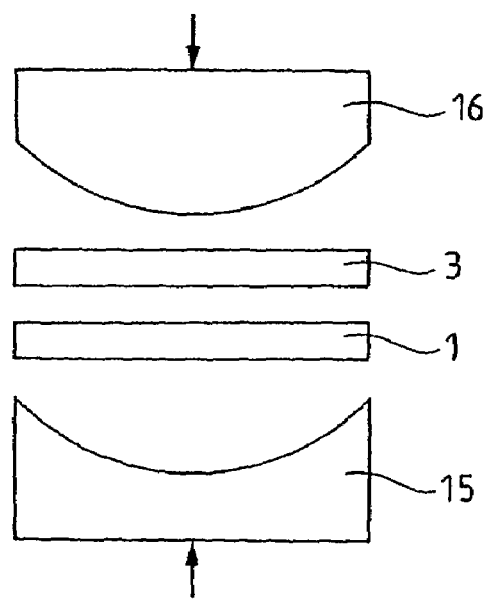

In a further variant, shown in FIG. 4, the two structures 1 and 3 are placed face to face without bonding them and are deformed simultaneously between a concave preform 15 and a convex preform 16 with complementary shapes. In FIG. 4 the arrows show the pressure forces to be applied to cause the deformation. The two structures are then deformed conjointly, a film of air remaining between the two structures. Once the required curvature has been achieved, the air film is evacuated and, because of the forces applied, bonding by molecular adhesion then takes place.

The two structures are preferably plane initially and of constant thickness. It is nevertheless clear that the structures may also have different geometries initially (in the relaxed state), for example non-plane geometries, so that they may be subjected to prestressing of different amplitudes at the time of assembly.

Air Bubbles

Figure 5A:
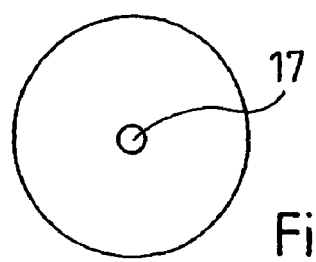
FIGS. 5A and 5B show two examples of conditioning a basic structure to prevent trapping air bubbles during assembly.

When the second structure 3 is deformed between the first structure 1 and the preform 4, an air bubble may be trapped between the two structures and impede bonding by molecular adhesion. To evacuate this air bubble, it is advantageous to pierce one or both of the structures to be assembled at their center 17, as shown in FIG. 5A, for example by laser drilling or deep etching of the structure. Aspiration means may advantageously be provided to facilitate evacuation of the air bubble through the resulting hole.

Figure 5B:
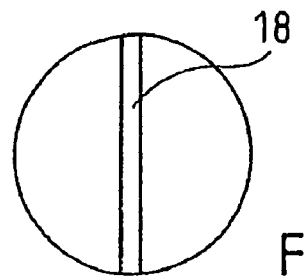

An alternative is to provide on one or both structures one or more evacuation channels 18 on the face to be assembled and discharging at the edge of the wafer, as shown in FIG. 5B. For example, these channels may have dimensions of the order of a width of 100 μm and a depth of 5 μm and be produced by the usual lithography and etching techniques. Aspiration means could advantageously be provided for aspirating the trapped air via the holes.

Another option may be to effect the deformation and the assembly under a partial vacuum in order to minimize the volume of trapped air, although this method has the drawback of necessitating much harder vacuums to ensure deformation by depressurization of the structures.

Among other options, there may also be mentioned that which consists in placing radial spacers at the wafer periphery and removing them once the central area has been bonded. More generally, any method may be used that enables initiation of bonding between the two structures at their center which then propagates toward the edges. For example, a slight difference in radius of curvature between the two structures could be introduced before bonding to achieve this.

Definition of the Structure

The methods described above therefore produce a complex structure by assembling two basic structures and, before bonding, imposing a tangential stress difference on the faces to be assembled.

The expression "basic structure to be assembled" means a thicker or thinner substrate, of simple or composite form (formed of a stack of different layers of one or more thicker or thinner materials), processed or not. The materials concerned are all the semiconductors, such as in particular silicon, germanium, their alloys $Si_{1-x}Ge_x$, indium phosphide (InP), gallium arsenide (GaAs), lithium niobate, silicon carbide (SiC), gallium nitride (GaN), sapphire, superconductors such as compounds of the YbaCuO, NbN, or BiSrCaCuO type, for example, or insulators such as, in particular, fused silica, quartz, glasses with different compositions, MgO, all metals such as in particular tungsten, copper or aluminum.

Removal of Preforms

After bonding by the method of the invention, there is obtained, by imposing a tangential stress difference between the faces of the two structures to be assembled, a stressed complex structure in which the stresses at all points are known. When the forces that deformed the two initial structures (mechanical pressure or aspiration by means of a vacuum) are removed, upon the release of the exterior faces of the complex structure, the stresses within that structure evolve, but in a particular manner that is known to the person skilled in the art. Among other things, this evolution is a function of the natures and the thicknesses of the various materials constituting each of the two initial structures and the stress difference at the bonding interface.

Thinning

Figure 6A:
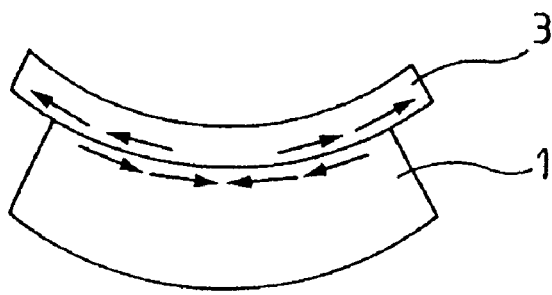
FIGS. 6A, 6B, 6C and 6D show one method of stressing a thin film by thinning stressed complex structures.

FIG. 6A shows the complex structure obtained after assembling a first structure 1 and a second structure 3 in the situation where the first structure 1 is deformed by a spherical concave preform and the second structure 3 is deformed by a spherical convex preform. In this case, the assembled face of the first structure 1 is spherical concave and is therefore in compression. The assembled face of the second structure 3 is spherical convex and is therefore in tension. The arrows in FIG. 6A represent the tangential internal stresses within the complex structure at the level of the assembled faces.

Figure 6B:
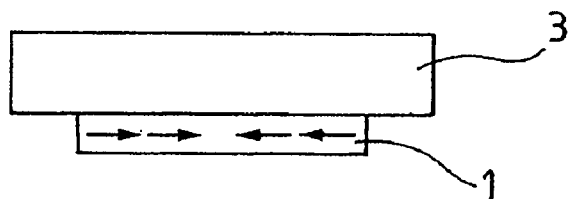

If one of the structures 1 or 3 is thinned, the internal stresses within the complex structure evolve again, in a predictable manner that is familiar to the person skilled in the art. If the first structure 1 is thinned, for example, the second structure 3 tends to relax, such as to resume its flatness, being less and less stressed by the thinned first structure 1. This is reflected in a reduction in the stresses on the assembled face of the second structure 3, generating, by virtue of the bonding, an increase in the stresses on the assembled face of the first structure 1. If thinning is continued until the first structure 1 is reduced to a thin film, there is obtained, as shown in FIG. 6B, a second structure 3 that is virtually flat, practically free of stress, and assembled to a thin film derived from the first structure 1 within which the internal stresses are relatively homogeneous and higher than those present at the assembled face of the structure 1 before thinning.

Figure 6C:
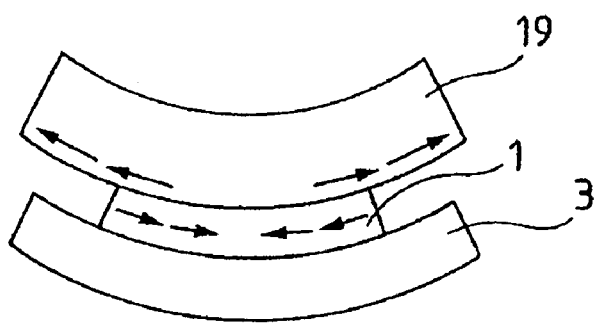
Figure 6D:
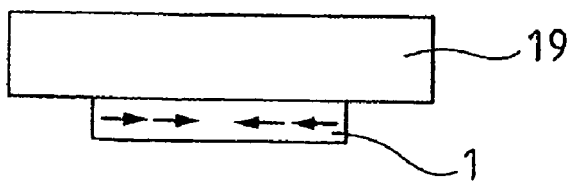

If required, the above method may be iterated as many times as necessary to obtain a given stress within a thin film. Accordingly, starting from the preceding example, for example, the structure obtained (consisting of the thin film derived from the first structure 1 bonded to the second structure 3) is assembled with another structure 19 after stressing both structures. The structure containing the thin film is advantageously curved so that the thin film is even more compressed before bonding, for example by virtue of curvature applied by means of a concave preform, as shown in FIG. 6C. The structure 19 is stressed by a convex preform so that its face to be assembled to the free face of the thin film 1 is expanded. This is followed by thinning (or even eliminating) the second structure 3, for example by mechanical means. As previously explained, the structure 19 relaxes progressively and there is finally obtained a thin film derived from the first structure 1 within which the internal stresses have been further increased, which is transferred onto a relaxed structure 19, as shown in FIG. 6D.

This method therefore produces a thin film, for example of silicon, stressed in tension or in compression to a required stress level. These stressed film have applications in microelectronics, in particular in the field of high frequencies, where carriers have higher mobility.

These complex stressed structures are thinned by a standard thinning method used in microelectronics, and the complex structure can if necessary be returned to a flat state by aspirating it onto a support at the time of mechanical polishing, for example.

Heat Treatment of a Heterostructure

It has been established that it is important to control the evolution of the stresses within a heterostructure when the various materials that constitute it have different coefficients of thermal expansion, because this difference is liable to damage the heterostructure in the event of a large temperature change, such as may be necessary to consolidate bonding, for example, or to effect technology steps for the fabrication of microelectronic components (epitaxy or heat treatment, for example).

Figure 7A:
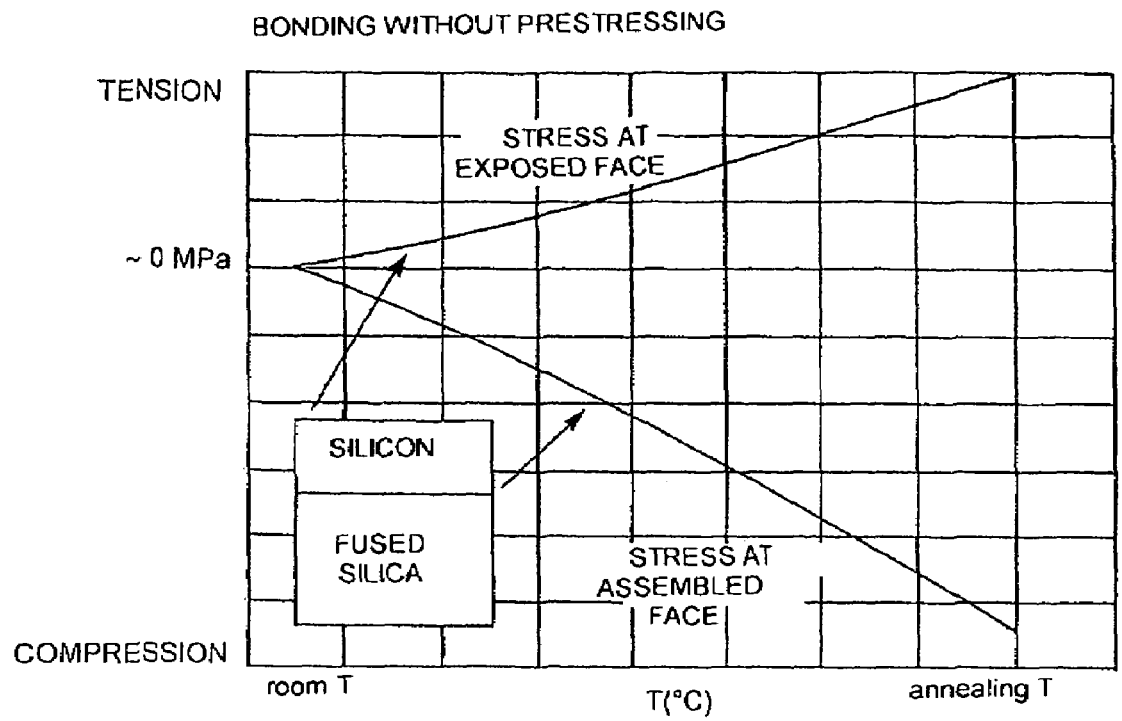
FIGS. 7A and 7B are diagrams of the evolution with temperature of the stresses at the two surfaces of a silicon substrate within a complex structure obtained by assembling silica and silicon substrates, with or without prestressing.

Consider, for example, a heterostructure formed of a layer of silicon (typically 750 μm thick) bonded to a fused silica substrate (typically of the order of 1200 μm thick) by bonding by molecular adhesion without prestressing. FIG. 7A shows the evolution of the stresses on the two faces of the silicon, i.e. the assembled face and the exposed face, as a function of the temperature during heat treatment, for example. Since silicon has a coefficient of thermal expansion higher than fused silica, when the temperature rises expansion of the assembled face of the silicon is impeded by the fused silica, which expands less than silicon. This face is therefore stressed in compression, causing expansion of its exposed face because of the stiffness of the silicon. If this evolution is not controlled, it can generate internal stresses within the structure that can damage or even destroy it.

Thus in the present example, for a heat treatment temperature of the order of 400° C., compression stresses of the order of 100 MPa are obtained at the assembled face of the silicon and expansion stresses of the order 60 MPa are obtained at its exposed face.

Figure 7B:
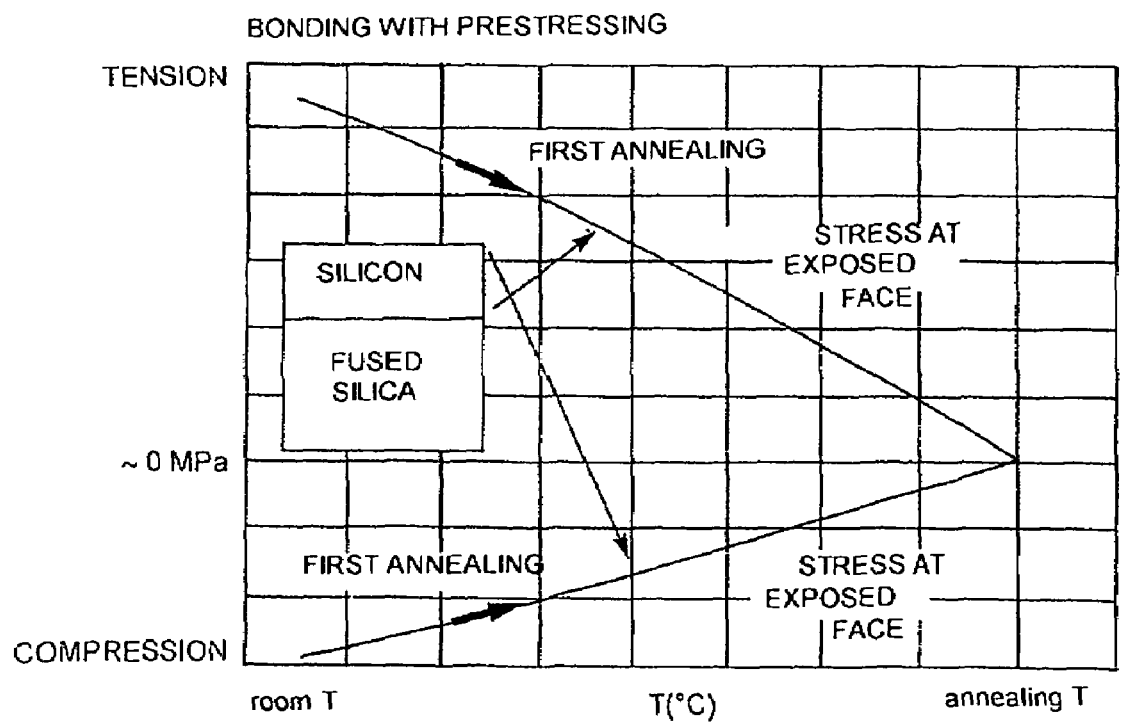

This evolution of the stresses with temperature is perfectly familiar to and quantifiable by the person skilled in the art. It is described in the following documents in particular: S. Timoshenko, J. Opt. Soc. Am. 11(1925) page 233 and D. Feijoo, I, Ong, K. Mitani, W. S. Yang, S. Yu and U. M. Gösele, Zhe-Chuan Feng and Hong-du Liu J; Appl. Phys. 54(1), 1983, page 83 "Generalized formula for curvature radius and layer stresses caused by thermal strain in semiconductor multilayer structures". To a first approximation, using continuous elastic theory mechanical calculations, if the materials are considered to be isotropic and the coefficients of thermal expansion are considered to be constant over the applicable temperature range, the evolution of the stresses is approximately linear with temperature, as shown in FIGS. 7A and 7B. More complex calculations (for example finite element calculations) may be used to refine these results.

It is therefore possible, by means of an inverse calculation, to define what stresses are necessary within the complex structure at room temperature to remain within an acceptable range of stresses over the range of temperature of use of that structure (up to the heat treatment temperature, for example). By an appropriate choice of the process of assembly under stress, it is also possible to minimize and even to eliminate stresses within a composite structure at a given temperature, for example the heat treatment temperature. FIG. 7B shows this in the context of the present example.

The next step is one of assembly in accordance with the invention by curving the fused silica and silicon structures prior to bonding, the face to be assembled of the silicon being in tension (for example convex) and that of the fused silica being in compression (for example concave). After bonding, at room temperature, the resulting heterostructure has particular internal prestresses, in the silicon layer in particular, and a radius of curvature of approximately 1.18 m (after releasing the forces necessary to impose the curvature). These prestresses within the silicon are selected so that they compensate some or all of the compressive effect of the fused silica on the silicon when the temperature rises. They may even be selected to eliminate the stresses within the silicon structure at the selected heat treatment temperature. This heat treatment may be necessary to reinforce the bonding of the fused silica/silicon, for example.

It has been shown that it is also possible to control the evolution of the stresses within a thin film in the event of evolution of the temperature of a heterostructure formed of that thin film bonded to a thick substrate of a different material. In this case, only the thin film is stressed, the substrate remaining virtually relaxed, because of its size, and stressing the thin film.

Figure 8A:
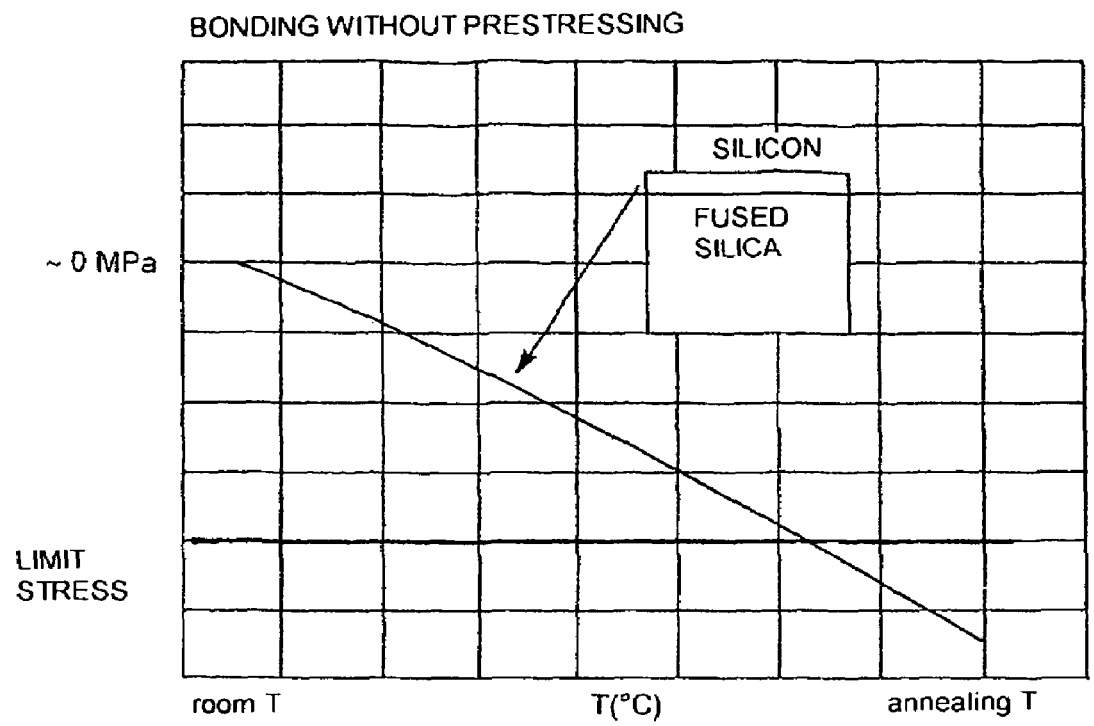
FIGS. 8A and 8B are diagrams of the evolution of the stresses with temperature at the bonding interface of a thin silicon layer of a complex structure obtained by silicon-silica assembly, with or without prestressing.
Figure 8B:
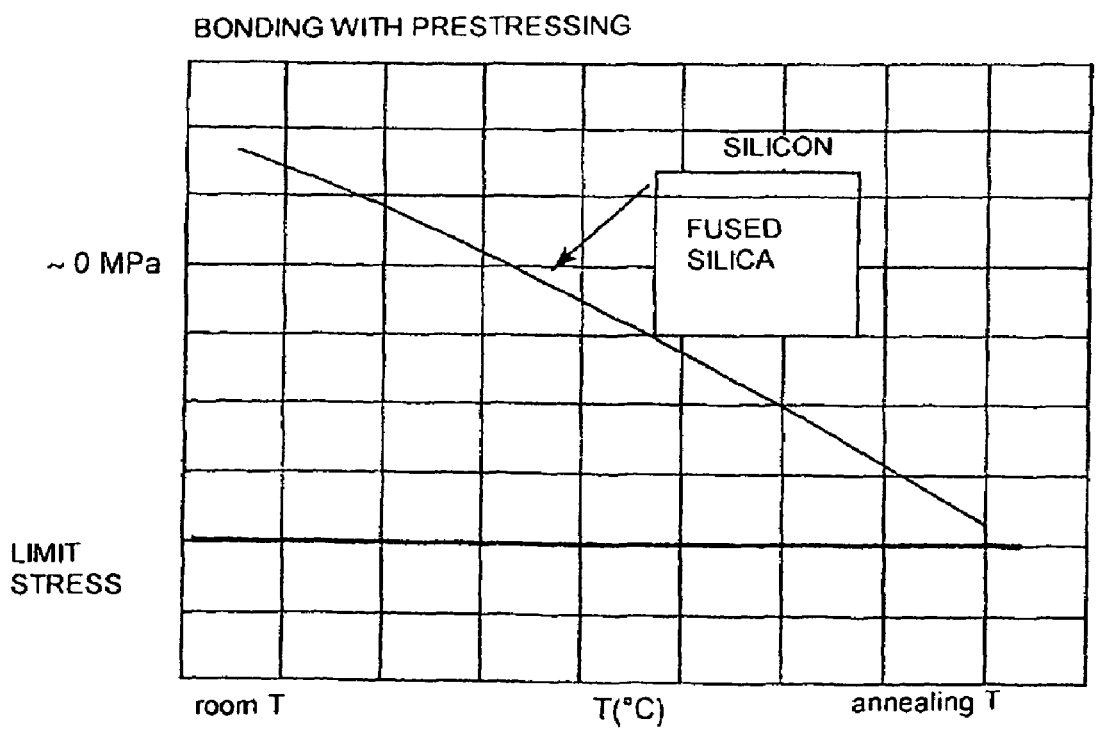

Consider, for example, a thin film of silicon (typically 0.4 μm thick) on a fused silica substrate 1200 μm thick. FIGS. 8A shows the evolution of the stresses within the silicon film. Starting from a heterostructure obtained by bonding without prestressing, the silicon film is progressively compressed as the temperature rises. In this way, for a 0.4 pμm thick film of silicon assembled on a 1200 μm thick fused silica substrate, at a temperature of 600° C., compression stresses are obtained within the thin film of the order of 500 MPa, which may approach or even exceed the fixed limit stress.

The method of the invention may be used to prestress the thin silicon film prior to bonding so that the film is sufficiently tensioned after bonding to compensate some or all of the compression caused by the silica when the temperature rises. In this way it is possible to remain within a range of acceptable stresses for the silicon film.

In the context of the present example, to carry out heat treatment at 800° C. without exceeding a limit stress level set for the purposes of this example at 500 MPa, it is sufficient, for example, to produce at room temperature a radius of curvature of approximately 1.25 m in an SOI substrate having at the surface a 0.4 μm thick silicon film and in the fused silica substrate so that the faces to be assembled of the SOI substrate and of the fused silica are respectively in tension (for example convex) and in compression (for example concave) prior to bonding. After bonding and removing the external stresses, the complex structure relaxes with a final radius of curvature of approximately 1.25 m. The SOI substrate is then thinned until the thin film of silicon is exposed; the fused silica relaxes, increasing the tension stress level in the thin film of silicon. This tension subsequently compensates some or all of the compression stresses within the thin film generated by increasing the temperature of the structure. Thus the stress remains below the fixed stress threshold. A similar method could be used to increase the stress level in the thin film of silicon and thereby to obtain a thin film of stressed silicon.

Lattice Parameter

Another important application of the stressed assembly process is adapting the lattice parameter of one material to the lattice parameter of another material, for example with a view to epitaxially growing the latter on the former. The person skilled in the art knows that curving a substrate changes its lattice parameter, especially at the surface. The method of the invention produces a curved structure that is easy to manipulate, without needing an external device to stress it after assembly and is therefore directly compatible with ultrahard vacuum epitaxial deposition machines, for example. By selecting appropriate stress levels prior to bonding, the structure has a given curvature at the surface and therefore a lattice parameter suitable for the epitaxial growth temperature, taking into account any coefficient of thermal expansion differences.

The invention can also produce a stressed thin film assembled on a substrate with the internal stresses in the thin film selected to obtain for the film a lattice parameter at the epitaxy temperature suitable for the material to be grown epitaxially. The method of obtaining a stressed thin film has been described hereinabove and may if necessary be iterated to obtain a given stress level within the thin film.

Phenomena of thermal expansion within the structure are also taken into account if necessary.

Figure 9A:
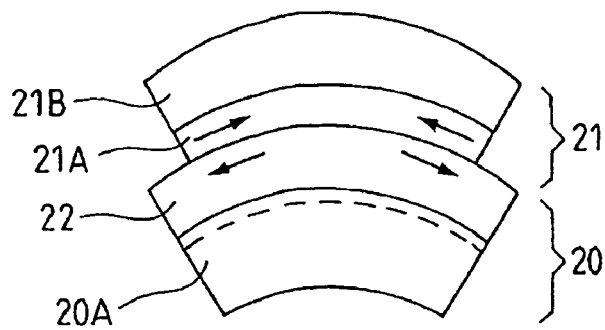
FIGS. 9A to 9F show the production of an epitaxy substrate of given lattice parameter.
Figure 9B:
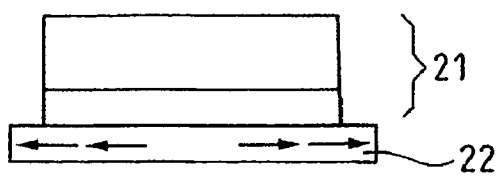
Figure 9C:
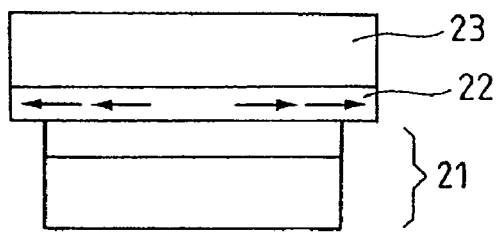
Figure 9D:
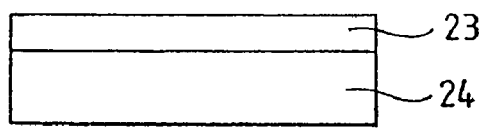

FIGS. 9A to 9F show a practical implementation of the above method. In FIG. 9A, an SOI substrate 20 consisting of a layer 22 of silicon on a substrate 20A formed of a silicon substrate and a layer of oxide is bonded under stress to a 400 nm oxidized silicon substrate 21 formed of a layer 21A of silica on a layer 21B of silicon, the face to be assembled of the SOI being in tension and that of the oxidized silicon in compression. After the forces necessary to obtain the curvatures have been removed, the complex structure has a radius of curvature of approximately 1 m. Then, as shown in FIG. 9B, the substrate 20A is removed by mechanical-chemical means. The oxide film of the substrate 20A, delimited by the dashed line in FIG. 9A, may remain or may be removed if necessary. The silicon film 22 transferred in this way onto the oxidized silicon 21 is then stressed in tension to an average value of approximately 180 MPa, thus forming a new SOI structure. Its lattice parameter is then varied by approximately 0.14%. As shown in FIG. 9C, this lattice parameter allows deposition onto the thin film 22 of an SiGe film 23 with a germanium concentration of approximately 3.5% relative to the silicon and with no lattice parameter mismatch. With this concentration of germanium, a germanium difference of plus or minus 0.5% may be tolerated without becoming incompatible with growing a 200 nm layer. The thickness of the SiGe is very homogeneous and its crystal quality is very good. The SiGe film is not stressed because its lattice parameter is respected.

To increase the germanium concentration in the SiGe alloy, instead of depositing 3.5% SiGe, the stressed silicon film may be further stressed by effecting further bonding under stress as explained above.

Figure 9E:
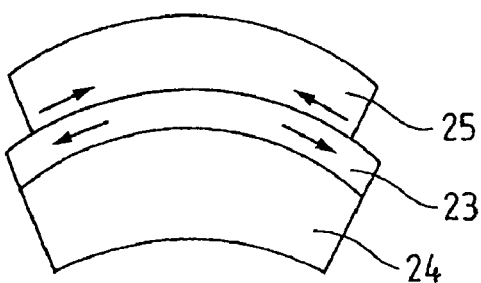
Figure 9F:
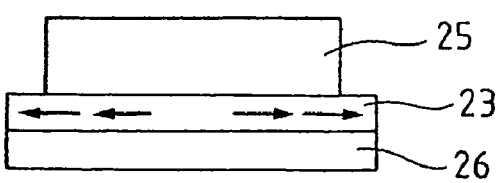

Another option is to repeat the bonding process under stress on the 3.5% SiGe. To this end, first of all, the thin film 23 of 3.5% SiGe is transferred to a relaxed support 24 using a standard microelectronics technique (for example bonding followed by mechanical thinning). The new structure shown in FIG. 9D comprising the transferred thin film 23 of SiGe is then obtained and curved, for example, and another structure 25, for example of silicon, may then be curved before bonding the two structures as shown in FIG. 9E. The FIG. 9C structure may also be bonded directly to this new structure 25 after curvature. The stress levels are selected so that the thin SiGe film 23 expands. The support 24 onto which the thin SiGe film 23 has been transferred is then removed, or in the case of direct bonding the layers 21 and 22 are removed. This further tensions the thin SiGe film 23, as shown in FIG. 9F. This increases its lattice parameter, which then becomes compatible with an SiGe deposit 26 with a higher concentration of germanium. This technique limits the stresses in the film used for epitaxy: the stresses in the SiGe film after bonding under stress are lower than would be necessary in the silicon film to obtain the same lattice parameter.

SiGe with a germanium concentration of 20%, for example, may easily be obtained by the above method, without limiting the thickness and with very good crystal homogeneity.

Hot Bonding

Diverse variants of the foregoing are feasible.

The preforms may be heated to enable hot bonding of the deformed intermediate structures. The preforms may advantageously be at different temperatures so that the two intermediate structures have a temperature difference at the moment of assembly.

Bonding the intermediate structures at high temperature also provides control over the internal stresses of the complex structure, in addition to the control already achieved through the controlled deformation of the intermediate structures.

For example, it is then possible to cancel the internal stresses of a complex structure at a given temperature by limiting the deformation of the intermediate structures. For example, it is not wished to deform to a radius of curvature of more than 1.4 m the two intermediate structures consisting of a 750 μm thick silicon wafer 200 mm in diameter and a 1200 μm thick fused silica wafer 200 mm in diameter. These two intermediate structures, deformed to a radius of curvature of approximately 1.4 m prior to bonding, yield a complex structure in which the internal stresses are eliminated at approximately 300° C. if bonding took place at 20° C. On the other hand, if the two intermediate structures are bonded at 100° C., the internal stresses of the complex structure are eliminated at 380° C., and thus at a higher temperature without having to deform further the intermediate structures.

Flow Layer

A layer that flows at a certain temperature Tf may be placed between the two intermediate structures. Introducing this flow layer modifies the internal stresses in the complex structure if the heat treatment temperature exceeds Tf.

This minimizes stresses during annealing, for example. Consider, by way of example, a complex structure consisting of a 1200 μm thick fused silica substrate of 200 mm diameter on which there is a 0.4 μm thick film of silicon. Creating the complex structure by means of the invention means that a heat treatment temperature Ttth of 800° C., for example, can be achieved without exceeding the stress level set to preserve good crystal quality in the silicon film (without prestressing the basic structures to form the complex structure, a temperature of 800° C. could not be reached without degrading the silicon film). On the other hand, if it is required to raise the heat treatment temperature without modifying the deformation of the basic structures used to obtain the complex structure, there is then the risk of exceeding the stress level that has been set. If there is a layer that flows at Tf, with Tf equal to 800° C., for example, as soon as the heat treatment temperature exceeds Tf the flow layer will flow, thereby relieving some of the internal stresses. Heat treatment can then be carried out at a temperature higher than Ttth without exceeding the internal stress level that has been set.

Working Under Pressure

The preforms may be molds, for example porous molds.

Figure 10:
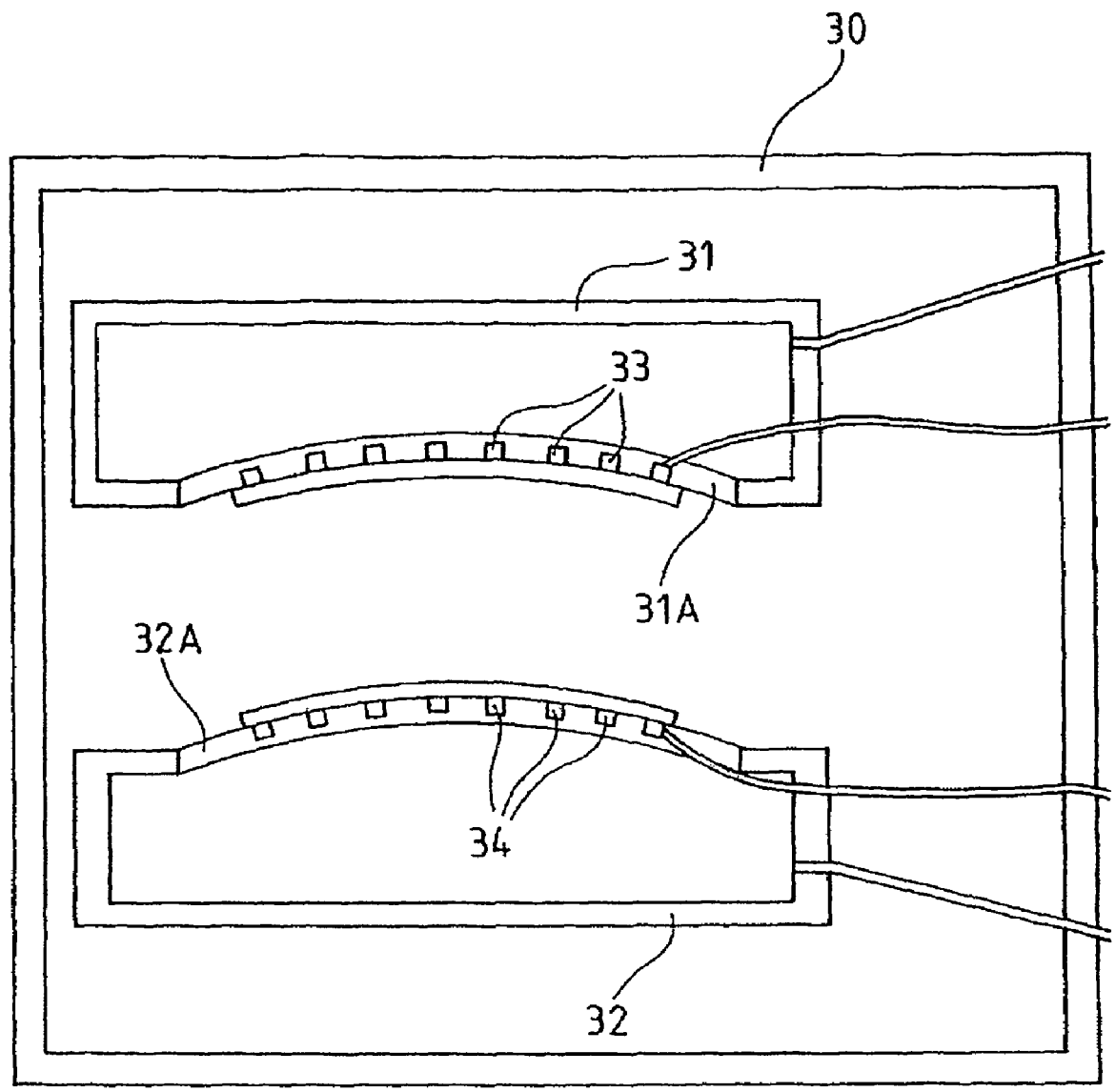
FIG. 10 is a diagrammatic view in section of a pair of deformable preforms.

If a pressure difference is used to deform the basic structures or to retain the basic structures on the preforms, it can be advantageous for one of the faces of the basic structures to be at a pressure other than atmospheric pressure, advantageously a pressure higher than atmospheric pressure. FIG. 10 shows by way of example an enclosure 30 containing two preforms 31 and 32 each including a deformable membrane 31A or 32A. Aspiration channels 33 and 34 open onto the surface of these membranes, and are represented here as being tangential. The aspiration or pressurization circuits are represented by double lines.

The aspiration channels maintain the basic structures in their deformed state; the area of the aspiration channels may be limited by subjecting the exposed face of the intermediate structure to a pressure higher than atmospheric pressure (for example a pressure inside the enclosure of 2 bar). Moreover, if the deformable preform is deformed by a pressure difference, a greater deformation can be achieved by increasing the pressure on the exposed face of the basic structure. For example, the preform 31 is at an internal pressure of 1.5 bar, the channels 33 are at a pressure of 0.3 bar, the preform 32 is at an internal pressure of 2.5 bar, and the channels 34 are at a pressure of 0.3 bar. The pressure of the enclosure (2 bar) is between the pressures of the preforms 31 and 32.

The method of the invention may be implemented in diverse atmospheres, controlled or not. In particular, it may be implemented in a hydrogen atmosphere.

The invention claimed is:

1. A method of producing a complex structure wherein respective connecting faces of two structures are brought into contact and assembled, the method comprising applying mechanical forces to each of the two structures before bringing them into contact to curve the two structures so that the connecting faces are respectively concave and convex and to create a tangential stress state difference, wherein the tangential stress state difference creates a predetermined stress state within the complex structure under subsequent processing conditions relative to the assembly conditions.

2. The method according to claim 1 further comprising deforming one of the two structures before bringing the two structures into contact.

3. The method according to claim 1 wherein creating a tangential stress state difference comprises generating stresses independently in each of the two structures.

4. The method according to claim 1, wherein curving the two structures comprises curving so that the connecting faces comprise complementary faces.

5. The method according to claim 4, wherein curving the two structures comprises curving so that the connecting faces respectively comprise spherical concave and spherical convex faces.

6. The method according to claim 1, wherein applying mechanical forces to each of the two structures comprises creating a pressure difference between connecting faces.

7. The method according to claim 6, wherein creating a pressure difference between the connecting faces comprises aspirating one of the two structures onto a concave preform having a suitable profile and imparting the profile to a face of the one structure, and wherein the one structure rests on the concave preform at its periphery.

8. The method according to claim 6, wherein creating the pressure difference between the connecting faces comprises aspirating one of the two structures into a cavity, the one structure resting locally at its periphery on a seal bordering the cavity.

9. The method according to claim 5 wherein applying mechanical forces comprises deforming one of the two structures between complementary first and second preforms, one of which is concave and the other of which is convex, and imparting selected profiles to the connecting face.

10. The method according to claim 9, wherein the first complementary preform comprises a concave structure curved to have a selected profile.

11. The method according to claim 9, wherein the second complementary preform includes aspiration channels for keeping the one structure curved after removing the first complementary preform.

12. The method according to claim 1, wherein applying mechanical forces comprises applying mechanical forces simultaneously to the two structures by deforming the two structures between two preforms having selected profiles to be imparted to the connecting faces.

13. The method according to claim 1, wherein applying mechanical forces comprises applying mechanical forces to at least one of the two structures by means of a preform consisting of a mold.

14. The method according to claim 13 wherein the preform consists of a porous mold.

15. The method according to claim 1, wherein applying mechanical forces comprises applying mechanical forces to the two structures using at least one deformable preform.

16. The method according to claim 1, two structures are assembled by molecular bonding.

17. The method according to claim 13 further comprising treating the connecting faces to facilitate bonding.

18. The method according to claim 1 the two structures are assembled by direct contact, wherein the face of at least one of the two structures is adapted to prevent air from being trapped between the connecting faces.

19. The method according to claim 18 further comprising piercing at least one of the two structures.

20. The method according to claim 19, wherein piercing at least one of the two structures comprising piercing the structure at its center.

21. The method according to claim 18 further comprising forming-in that at least one of the two structures at least one dead-end channel discharging at the edge of the structure.

22. The method according to claim 1, wherein the two structures are assembled by means of a flow layer.

23. The method according to claim 1, wherein the two structures are assembled at a temperature higher than room temperature.

24. The method according to claim 23 further comprising heating the two structures by contact with heated preforms.

25. A method according to claim 24, wherein the preforms are heated to respective different temperatures.

26. A method according to claim 1 further comprising a technology step including a change of temperature, wherein the tangential stress state difference between the connecting faces is selected so that stresses within the complex structure remain below a predetermined stress threshold.

27. The method according to claim 26, wherein the technology step comprises a heat treatment step.

28. The method according to claim 1 further comprising, after assembling the two structures, a step of thinning one of the two structures to produce a thin film, wherein the tangential stress state difference is selected to impose a predetermined stress level within the thin film.

29. The method according to claim 28 further comprising assembling the thin film to another structure by creating, prior to assembly, a tangential stress state difference between the connecting faces, wherein tangential stress state difference is selected to obtain within the new assembled structure a predetermined stress state under subsequent processing conditions relative to the assembly conditions.

30. The method according to claim 1 further comprising producing an epitaxially grown thin film of a material on an external face of the complex structure, wherein the tangential stress state difference is selected so that, at the epitaxy temperature, the external face has a lattice parameter compatible with epitaxial growth of the material.

31. The method according to claim 30 wherein the structure on which the epitaxially grown thin film is formed is obtained by thinning the structure after assembly.

32. The method according to claim 30 further comprising the following steps:
assembling the complex structure including the epitaxially grown film onto another structure via respective connecting faces by creating, a tangential stress state difference between two new faces to be assembled prior to assembly,
thinning the complex structure to expose a face of the epitaxially grown thin film, and
epitaxially growing a new material on the exposed face of the thin film,
wherein the tangential stress state difference between the two new faces is selected so that the lattice parameter of the epitaxially grown thin film is compatible with epitaxial growth of the new material.

33. The method according to claim 1, wherein the method is carried out in a controlled atmosphere.

34. The method according to claim 1 wherein the method is carried out in a hydrogen atmosphere.

35. A method of producing a complex structure comprising:
providing two structures;
applying mechanical forces to each of the two structures so that the two structures have respective concave and convex faces;
bringing the concave and convex faces into contact and assembling the faces, such that there is a tangential stress difference between the faces during assembling; and
removing the mechanical forces,
whereby a predetermined stress state exists between the two assembled structures after removing the mechanical forces.

36. A method of producing a complex structure wherein respective connecting faces of two structures having different coefficients of thermal expansion or different lattice constants, or both, are brought into contact and assembled, the method comprising:
applying mechanical forces to each of the two structures before bringing them into contact to curve the two structures and to create a tangential stress state difference,
wherein the tangential stress state difference causes a predetermined stress state within the complex structure configured to provide a surface having a predetermined lattice parameter under subsequent processing conditions relative to the assembly conditions.

* * * * *

UNITED STATES PATENT AND TRADEMARK OFFICE
CERTIFICATE OF CORRECTION

PATENT NO. : 7,550,052 B2 Page 1 of 1
APPLICATION NO. : 10/537679
DATED : June 23, 2009
INVENTOR(S) : Franck Fournel et al.

It is certified that error appears in the above-identified patent and that said Letters Patent is hereby corrected as shown below:

On the Title Page

"Item" (75), inventor: after "Saint-Egreve (FR);" replace "Phillippe" with --Philippe--.

Signed and Sealed this

Fifteenth Day of June, 2010

David J. Kappos
*Director of the United States Patent and Trademark Office*